(12) United States Patent
Augendre et al.

(10) Patent No.: US 11,848,191 B2
(45) Date of Patent: Dec. 19, 2023

(54) RF SUBSTRATE STRUCTURE AND METHOD OF PRODUCTION

(71) Applicant: COMMISSARIAT A L'ENERGIE ATOMIQUE ET AUX ENERGIES ALTERNATIVES, Paris (FR)

(72) Inventors: Emmanuel Augendre, Grenoble (FR); Shay Reboh, Grenoble (FR); Pablo Acosta Alba, Grenoble (FR); Thomas Lorne, Grenoble (FR); Emmanuel Rolland, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 17/644,483

(22) Filed: Dec. 15, 2021

(65) Prior Publication Data
US 2022/0189994 A1    Jun. 16, 2022

(30) Foreign Application Priority Data
Dec. 16, 2020    (FR) ...................................... 20 13364

(51) Int. Cl.
*H01L 21/00*    (2006.01)
*H01L 27/12*    (2006.01)
(Continued)

(52) U.S. Cl.
CPC ........ *H01L 27/1203* (2013.01); *H01L 21/763* (2013.01); *H01L 21/76254* (2013.01); *H01L 28/10* (2013.01); *H01L 29/0603* (2013.01); *H01L 29/32* (2013.01); *H01Q 1/2283* (2013.01); *H01L 21/0245* (2013.01);
(Continued)

(58) Field of Classification Search
CPC ........... H01L 27/1203; H01L 21/76254; H01L 21/763; H01L 28/10; H01L 29/0603; H01L 29/32; H01L 21/0245; H01L 21/02532; H01L 21/02592; H01L 21/02667; H01L 21/02686; H01L 21/2636; H01L 21/26533; H01L 21/268; H01L 21/324; H01L 27/13; H01L 29/04; H01L 29/1604
See application file for complete search history.

(56) References Cited

U.S. PATENT DOCUMENTS 10,250,282 B2    4/2019  Kononchuk et al.
11,195,711 B2   12/2021  Acosta Alba et al.
(Continued)

FOREIGN PATENT DOCUMENTS

WO    WO 2011/066035 A2    6/2011
WO    WO 2016/149113 A1    9/2016
WO    WO 2017/144821 A1    8/2017

OTHER PUBLICATIONS

Prussin et al., "Formation of amorphous layers by ion implantation", Journal of Applied Physics 57 (2), 1985, 7 pages.
(Continued)

*Primary Examiner* — Richard A Booth
(74) *Attorney, Agent, or Firm* — Oblon, McClelland, Maier & Neustadt, L.L.P.

(57) ABSTRACT

Producing a semiconductor or piezoelectric on-insulator type substrate for RF applications which is provided with a porous layer under the BOX layer and under a layer of polycrystalline semiconductor material.

17 Claims, 15 Drawing Sheets

(51) Int. Cl.

| | |
|---|---|
| *H01L 21/762* | (2006.01) |
| *H01L 21/763* | (2006.01) |
| *H01L 49/02* | (2006.01) |
| *H01L 29/06* | (2006.01) |
| *H01L 29/32* | (2006.01) |
| *H01Q 1/22* | (2006.01) |
| *H01L 21/02* | (2006.01) |
| *H01L 21/263* | (2006.01) |
| *H01L 21/265* | (2006.01) |
| *H01L 21/268* | (2006.01) |
| *H01L 21/324* | (2006.01) |
| *H01L 27/13* | (2006.01) |
| *H01L 29/04* | (2006.01) |
| *H01L 29/16* | (2006.01) |
| *H03H 9/64* | (2006.01) |

(52) U.S. Cl.
CPC .. *H01L 21/02494* (2013.01); *H01L 21/02532* (2013.01); *H01L 21/02592* (2013.01); *H01L 21/02667* (2013.01); *H01L 21/02686* (2013.01); *H01L 21/268* (2013.01); *H01L 21/2636* (2013.01); *H01L 21/26533* (2013.01); *H01L 21/324* (2013.01); *H01L 27/13* (2013.01); *H01L 29/04* (2013.01); *H01L 29/1604* (2013.01); *H03H 9/64* (2013.01)

(56) References Cited

U.S. PATENT DOCUMENTS

| | | |
|---|---|---|
| 2004/0253458 A1 | 12/2004 | Matusmoto et al. |
| 2018/0233400 A1* | 8/2018 | Wang .................. H01L 21/0245 |
| 2018/0337043 A1 | 11/2018 | Englekirk et al. |
| 2019/0058031 A1 | 2/2019 | Figuet et al. |
| 2021/0183690 A1 | 6/2021 | Reboh et al. |

OTHER PUBLICATIONS

Oliviero et al., "Lithium implantation at low temperature in silicon for sharp buried amorphous layer formation and defect engineering", Journal of Applied Physics 113, 2013, 8 pages.

De Souza et al., "Amorphization/recrystallization of buried amorphous silicon layer induced by oxygen ion implantation", Journal of Applied Physics 95, 877, 2004, 1 page (Abstract Only).

Oliviero et al., "Helium implantation in silicon: the effects of implantation temperature", Materials Science and Engineering B102, 2003, 6 pages.

Johnson et al., "Dopant-enhanced solid phase epitaxy in buried amorphous silicon layers", arXiv.org, Jul. 30, 2010, 45 pages.

U.S. Appl. No. 16/590,557, filed Oct. 2, 2019, 2020/0111872 A1, Reboh, S, et al.

U.S. Appl. No. 16/709,993, filed Dec. 11, 2019 2020/0194273 A1, Reboh, S, et al.

U.S. Appl. No. 16/733,006, filed Jan. 2, 2020, 2020/0219762 A1, Reboh, S, et al.

U.S. Appl. No. 16/914,541, filed Jun. 29, 2020, 2021/0005443 A1, Gabel, L, et al.

U.S. Appl. No. 16/993,864, filed Aug. 14, 2020, 2021/0057267 A1, Acosta Abla, P, et al.

U.S. Appl. No. 17/103,219, filed Nov. 24, 2020, 2021/0098265 A1, Maitrejean, S, et al.

U.S. Appl. No. 17/124,184, filed Dec. 16, 2020, 2021/0305097 A1, Reboh, S, et al.

U.S. Appl. No. 17/216,842, filed Mar. 30, 2021, 2021/0328014 A1, Reboh, S, et al.

U.S. Appl. No. 17/362,369, filed Jun. 29, 2021.

U.S. Appl. No. 17/443,842, filed Jul. 28, 2021, Quintero Colmena, A, et al.

U.S. Appl. No. 17/445,747, filed Aug. 24, 2021, Niebojewski, H, et al.

U.S. Appl. No. 17/454,091, filed Nov. 9, 2021, Augendre, E, et al.

U.S. Appl. No. 17/456,607, filed Nov. 26, 2021, Reboh, S, et al.

* cited by examiner

RF SUBSTRATE STRUCTURE AND METHOD OF PRODUCTION

TECHNICAL FIELD AND STATE OF PRIOR ART

The field of the invention is that of semiconductor-on-insulator type substrates, especially for radio frequency (RF) applications.

The invention more particularly relates to an improved structure of a semiconductor or piezoelectric on-insulator type substrate with an electric trap-rich layer as well as its manufacturing method.

For RF applications, and in particular those operating at a high frequency, typically above 700 MHz, the substrates have to act as a support for the circuits without disturbing the operation thereof. In particular, it is sought to eliminate propagation losses, crosstalk or parasitic harmonics.

Various types of substrates are used today for RF applications, especially glass, quartz, highly resistive silicon and substrates of ceramics. These substrates have in common to behave as an insulating layer in order to avoid ohmic losses and parasitic capacitive couplings.

Substrates of the semiconductor-on-insulator type adapted for RF applications, in particular those of the RF-SOI (SOI for "Silicon-On-Insulator") type, in turn have the advantage of allowing co-integration of RF circuits with other circuits such as switches and amplifiers made in a more conventional technology.

A semiconductor-on-insulator type substrate is commonly formed by a semiconducting support layer covered, and in contact, with an insulating layer, itself covered, and in contact, with a semiconducting surface layer generally to act as an active layer, that is, in which active components, such as transistors, or passive components, in particular RF circuits, are to be formed.

For RF applications, known adaptations of such substrates consist in:
  providing a support layer of weakly doped resistive semiconductor material and,
  forming under and against the insulating layer commonly called "BOX" a trap-rich layer commonly called "trap rich" layer that is formed of a semiconductor material rich in crystal defects and/or grain boundaries and which allows trapping charges. Without this trap-rich layer, fixed (positive) charges in the BOX would induce the presence of mobile charges (electrons) in the support layer in the vicinity of the BOX, locally cancelling the benefit from the weak doping of the support layer.

The trap-rich layer is usually formed by a polycrystalline silicon layer. The polycrystalline silicon layer works all the better as it has a high density of grain boundaries that are all trapping sites.

However, the efficiency of the trap-rich layer can be reduced when, during the manufacture of the substrate and then of the final device on this substrate, it undergoes some heat treatment steps. At high temperatures, for example above 1000° C., the grain size in the trap-rich layer can especially increase, which can reduce its efficiency.

In order to avoid negative effects of heat treatment on the trap-rich layer, an interlayer can be integrated between the support layer of highly resistive semiconductor material and the trap-rich layer of polycrystalline silicon. In this way, a transmission of the crystal structure from the support layer to the trap-rich layer of polycrystalline material can be delayed and a modification of the structure of the same can be prevented.

In document WO2012/127006, such an interlayer is provided made of silicon oxide, while in document WO2017/144821 A1 a carbon or SiC interlayer is incorporated. In these methods, at least one additional polishing step by CMP ("Chemical Mechanical Polishing") is implemented. But the use of this type of step may turn out to be expensive.

Document WO2016/149113, for its part, provides for the production of a trap-rich layer of silicon in which cavities are formed and then filled with polysilicon or amorphous silicon or even silicon oxide. Filling is again typically followed by a polishing step by CMP.

There arises the problem of finding an improved structure of active layer on insulator substrate.

DISCLOSURE OF THE INVENTION

According to an aspect, the present application relates to a substrate comprising a surface layer disposed on, and in contact with, an insulating layer, said insulating layer being disposed on, and in contact with, a pedestal,
  said pedestal comprising:
    a support layer of a given semiconductor material,
    a trap-rich layer, said trap-rich layer comprising a layer of polycrystalline semiconductor material located between said insulating layer and said support layer,
  said pedestal further comprising, between said support layer and said insulating layer:
    a porous layer provided with a lower face in contact with said support layer, said porous layer being formed of a solid skeleton and a distribution of pores that are empty and/or gas filled.

The pores of the porous layer are typically closed pores.

Such a porous layer can help prevent the propagation of a recrystallisation front from the support layer to the insulating layer while acting as a trap-rich layer.

The given semiconductor material of the support layer may in particular be a material with a resistivity greater than 500 Ω·cm.

The surface layer may be a layer in or above which at least one component, in particular an RF circuit component, is formed or is capable of being formed.

The RF component may in particular be an inductor or an antenna.

According to one particular arrangement, the RF component may be formed above a region where the surface semiconducting layer is not present and may have been replaced, for example by a layer of silicon oxide (typically $SiO_2$).

According to one embodiment, the layer of polycrystalline semiconductor material comprises an upper face in contact with the insulating layer and a lower face opposite to the upper face, the lower face being in contact with the porous layer.

Advantageously, an upper portion of the solid skeleton of the porous layer is in contact with the lower face and being made of polycrystalline semiconductor material. In this case, a lower portion of the solid skeleton of the porous layer may be made of single crystal semiconductor material.

Advantageously, the trap-rich layer and the porous layer are distinct layers, said solid skeleton being at least partially a single crystal skeleton.

According to one particular embodiment, the solid skeleton of the porous layer is integrally made of a single crystal semiconductor material, with the porous layer and the layer of polycrystalline semiconductor material being superimposed to each other.

According to one particular embodiment, a layer of amorphous semiconductor material may be arranged between the trap-rich layer and the porous layer.

According to one advantageous embodiment, the layer of polycrystalline semiconductor material and the porous layer are localised and located facing a given region of said surface layer while another region of said surface layer juxtaposed to said given region is not located facing said layer of polycrystalline semiconductor material or said porous layer.

Advantageously, said polycrystalline semiconductor material is polycrystalline silicon.

The present application also relates to a structure comprising such a substrate and/or formed from such a substrate.

According to a particular aspect, an embodiment relates to a microelectronic device provided with a structure having a substrate as defined above with a semiconducting surface layer, the microelectronic device comprising:
  at least one transistor, the transistor having a channel region arranged in said semiconducting surface layer, and/or
  at least one RF component, in particular of the inductor or antenna type.

The RF component may be formed above the surface semiconducting layer or above a region juxtaposed to the surface semiconducting layer and in particular a region formed by a layer of silicon oxide typically SiO$_2$.

According to a particular aspect, an embodiment provides a substrate as defined above with a surface layer of piezoelectric material.

According to another aspect, an embodiment provides a method for manufacturing a structure as defined above.

The porous layer is typically produced by porosifying a layer of given semiconductor material of the pedestal.

According to a possible implementation, porosifying can be performed by hydrogen or rare gas implantation, the implantation being followed by thermal annealing and/or laser treatment.

According to a possible implementation, porosifying may be performed so as to form a porous surface region on the surface of said pedestal.

Thus, when porosifying comprises at least one implantation, this implantation may be performed so as to form a porous surface region on the surface of said pedestal.

According to a possible implementation, producing the layer of polycrystalline semiconductor material may comprise depositing a layer of amorphous semiconductor material on the porous layer, and in particular directly in contact with said porous layer.

Producing the layer of polycrystalline semiconductor material may further comprise an amorphisation implantation of a region of said pedestal. Thus, an amorphous region is formed.

According to another possible implementation of the method, the porous layer is formed by implantation so as to keep a non-porous surface region on the porous layer, the amorphisation implantation then being performed so as to form the amorphous region in at least this surface region or in at least this surface region as well as in an upper portion of the porous layer.

According to an embodiment, the method may further comprise a recrystallisation step, by laser annealing and/or by thermal annealing of temperature and duration provided so as to transform said layer of amorphous semiconductor material or said amorphous region into said layer of polycrystalline material.

Advantageously, the porous layer and the layer of polycrystalline material may be produced in a bulk substrate forming the pedestal, the method further comprising a step of attaching a donor substrate onto the bulk substrate, the donor substrate comprising an insulating layer and a layer of piezoelectric or semiconductor material in which the surface layer is adapted to be formed.

A step of removing a portion of the donor substrate and in particular the given layer can then advantageously be performed, for example by a Smartcut™ type method or in which an embrittlement zone is created in the handle substrate, and then separating a thickness of the handle substrate at this embrittlement zone.

Alternatively, the porous layer is made of a bulk substrate forming said pedestal, and the layer of polycrystalline material is made after attaching, in particular by bonding, said bulk substrate onto a donor substrate comprising an insulating layer.

Alternatively, the porous layer and the layer of polycrystalline material are made after attaching, in particular by bonding, said bulk substrate onto a donor substrate comprising an insulating layer.

According to another alternative, the porous layer and the layer of polycrystalline material are made of a semiconductor-on-insulator substrate or of a semiconductor-on-insulator substrate type structure while being produced.

Advantageously, the method may then further comprise forming a porosity closure layer on said given face.

Producing the porosity closure layer may comprise at least one step of:
  implanting amorphisation of an upper portion of said porous upper region and/or,
  depositing a layer of amorphous semiconductor material onto said porous upper region.

Advantageously, the porosity closure layer is an amorphous silicon region and wherein the method further comprises at least one heat treatment so as to transform said amorphous silicon region into a polysilicon based region.

After porosification, the method may further include at least one thermal annealing for discharging gaseous species from the pores.

After porosification, the method may further include at least one thermal annealing, in particular under an oxidising atmosphere, for reinforcing said solid skeleton.

BRIEF DESCRIPTION OF THE DRAWINGS

The present invention will be better understood based on the following description and the appended drawings in which.

Identical, similar, or equivalent parts of the various figures bear the same numerical references so as to facilitate switching from one figure to another.

The various parts represented in the figures are not necessarily represented on a uniform scale, to make the figures more legible.

Further, in the following description, terms that depend on the orientation of a structure such as "front," "upper," "rear," "lower," apply assuming the structure is oriented as illustrated in the figures.

DETAILED DISCLOSURE OF PARTICULAR EMBODIMENTS

Figure 1:
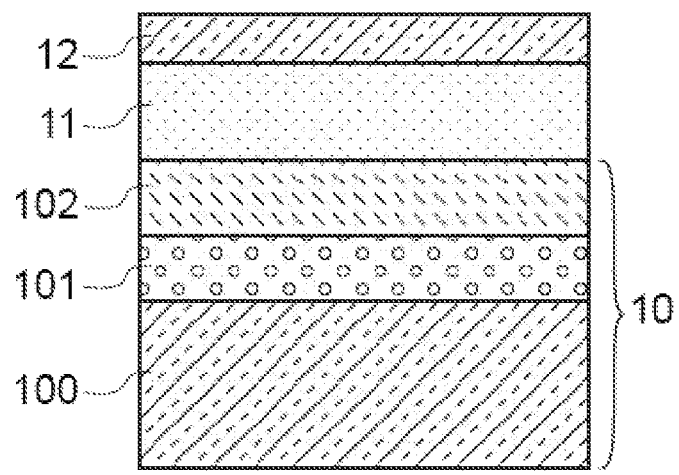
FIG. 1 serves to illustrate a substrate according to an embodiment of the present invention adapted for RF applications and provided with a layer of porous semiconductor material.

A semiconductor-on-insulator type substrate as implemented according to an embodiment of the present invention is illustrated in FIG. 1.

This substrate includes a surface semiconducting layer 12 in which at least one component or portion of a component, in particular of an RF circuit, is to be at least partially formed. The surface semiconducting layer 12 may accommodate especially the transistor channel region. The surface semiconducting layer 12 may also be a layer on which one or more RF (radio frequency) components, that is, for transmitting and/or receiving RF signals, for example, such as an antenna or an inductor, are to be formed.

The surface semiconducting layer 12 has a thickness that may be between 10 nm and 1 µm. This surface layer 12 can be made of silicon, for example, in the case where the substrate is of the SOI type and rests on an insulating layer 11. The insulating layer 11 is typically made of silicon oxide 11 and has a thickness that can be between 10 nm and 1 µm. The insulating layer 11 is in contact with the surface layer 12 and insulates the latter from a pedestal 10 here formed by superimposing layers 100, 101, 102.

The pedestal 10 comprises a so-called "support" layer 100 based on a resistive semiconductor material, in other words with high resistivity, that is greater than 500 Ω·cm and preferably greater than 1 kΩ·cm.

Between this support layer 100 and the insulating layer 11, at least one trap-rich layer is provided, preferably two trap-rich layers are provided, for adapting the substrate to RF applications by limiting propagation losses and crosstalk phenomena. The first trap-rich layer, is a layer with crystal defects and/or grain boundaries. The trap-rich layer comprises or is formed by a layer 102 of polycrystalline semiconductor material, typically polycrystalline silicon. The layer 102 of polycrystalline semiconductor material is located under the insulating layer 11 and is preferably in direct contact with the latter. The layer 102 of polycrystalline semiconductor material has a thickness that is typically less than that of the support layer 100 and may be between 5 nm and 1 µm, advantageously between 5 nm and 500 nm, preferably between 5 nm and 50 nm.

In order especially to prevent recrystallization of this layer from the support layer 100 during any thermal annealing that the substrate may undergo, one feature thereof is to comprise a porous layer 101. This porous layer 101 here separates the layer 102 of polycrystalline semiconductor material from the support layer 100. The porous layer 101 also contributes to limiting phenomena of parasitic conduction under the insulator and then forms the second trap-rich layer.

The porous layer 101 is in this example provided with an upper portion in contact with a lower face of the layer 102 of polycrystalline semiconductor material. The layer 102 of polycrystalline semiconductor material is thus sandwiched between the porous layer 101 and the oxide layer 11. The porous layer 101 can be provided with a thickness of, for example, between 30 nm and 2 µm, advantageously between 30 nm and 1 µm.

The porous layer 101 comprises a porosity formed by a distribution of pores, in particular closed pores, typically empty and/or filled with gas, typically a rare gas or hydrogen. Such a layer 101 for example of porous silicon, can be in particular obtained by porosifying the support layer 100. The porous layer 101 can thus be formed by a solid skeleton based on the same material as the support layer, such as single crystal silicon, and which reveals spaces or pores that are not filled with material in the solid state. The pores can have a diameter of, for example, between 2 nm and 250 nm, advantageously between 5 nm and 100 nm.

The type of porosity, here with mostly closed pores, depends on its production method. For example, a method in which porosification includes implantation may promote obtaining closed pores, whereas a chemical or electrochemical treatment would lead to open porosity.

The porous layer 101, arranged between the support layer 100 and the layer 102 of polycrystalline semiconductor material, prevents the single crystal material of the support layer 100 from making that of the layer 102 a single crystal material by recrystallization.

There can be a superimposition between the porous layer and the trap-rich layer. The porous layer 101 and the trap-rich layer can be one and the same layer.

Figure 2A:
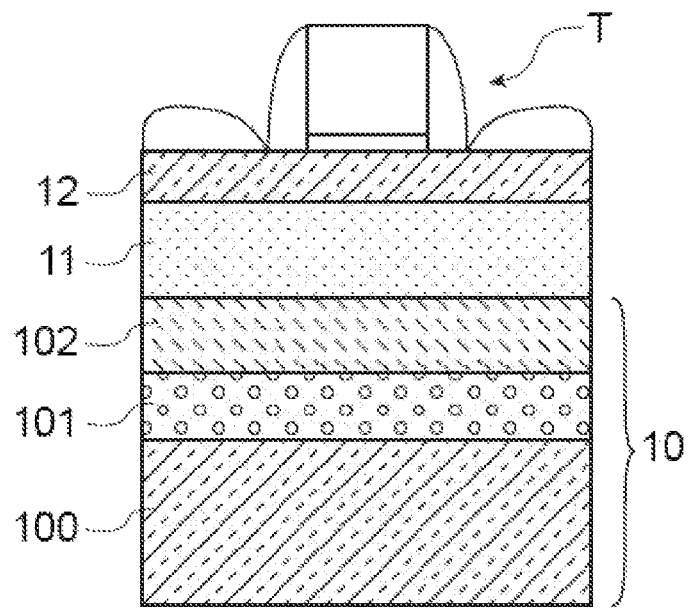
FIGS. 2A, 2B serve to illustrate an RF microelectronic device made on a substrate as implemented according to an embodiment of the present invention.

A substrate as illustrated in FIG. 1 may be required to undergo technological steps of producing active and/or passive components. For example, steps of manufacturing transistors according to a CMOS technology can be performed from such a substrate. A microelectronic device provided with a transistor T made on such a substrate is illustrated in FIG. 2A.

RF components, in particular in the form of inductor(s) or antenna(s) can also be formed on such a substrate in order to produce an RF circuit, in particular capable of operating at frequencies above 700 MHz.

Figure 2B:
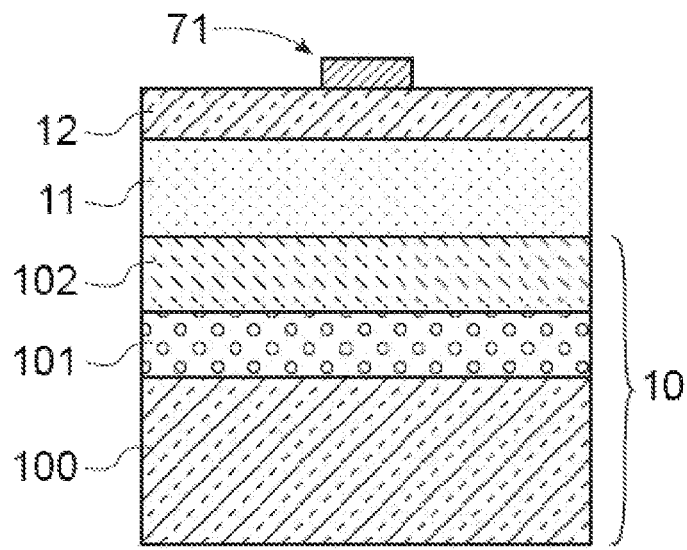

In FIG. 2B, an antenna or inductor conductor track 71 made on the surface layer 12 of such a substrate is thus represented. As an alternative (not represented), an antenna or inductor type RF component may be provided on a region of the substrate juxtaposed to the surface layer 12 and corresponding to a zone of the surface layer 12 replaced by another material, for example silicon oxide ($SiO_2$).

A first exemplary embodiment of a substrate of the type previously described will now be given.

Figure 3A:
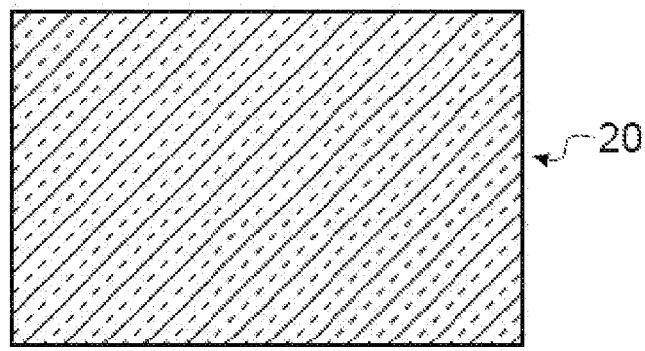
FIGS. 3A, 3B, 3C, 3D, 3E, 3F serve to illustrate an exemplary method for manufacturing a pedestal for a semiconductor-on-insulator type substrate, this pedestal comprising a layer of polycrystalline semiconductor material and a porous layer.

A starting material for this method can be a support 20, called a "pedestal" substrate, of single crystal semiconductor material, in particular a "bulk" substrate, for example of silicon, preferably weakly doped, which results in a resistivity greater than 500 Ω·cm and advantageously greater than 1 kΩ·cm (FIG. 3A).

A porous layer is then formed in this substrate 20, for example by porosifying a layer of silicon, in particular single crystal silicon.

One method for producing this porous layer comprises implanting light ions, in particular hydrogen ions or a rare gas such as, for example, Helium, or Neon, or Argon.

Figure 3B:
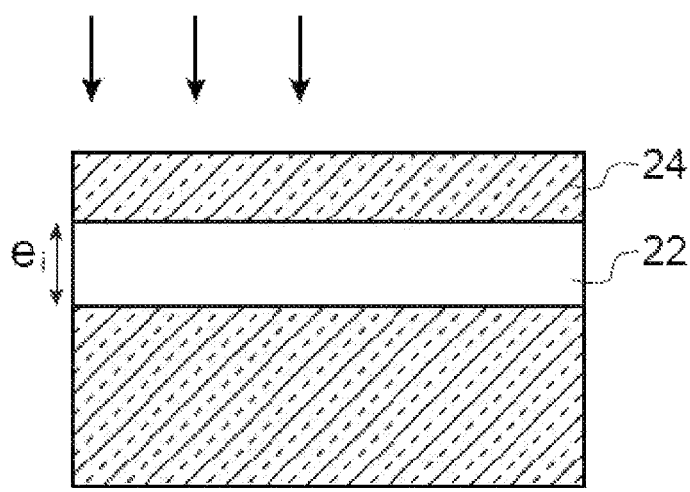

The implantation dose and energy can be chosen depending on the thickness that is desired to be imparted to the implanted zone 22 in which the porous layer will be contained. Implantation conditions can also be chosen so as to keep a non-implanted region 24 on the surface of the support 20 (FIG. 3B). The implanted zone 22, which in this case is referred to as "buried" zone, may have a thickness $e_i$ of at least 100 nm, for example.

In this exemplary embodiment, on the surface of the support 20, a non-implanted region 24 with a thickness of, for example, 5 nm to 200 nm can be kept.

The implantation dose and energy can be determined using a tool such as SRIM (acronym for "Stopping and Range of Ions in Matter") or TRIM ("TRansport of Ions in Matter") which allows modelling of ion implantation interaction with different materials. For example, for Helium implantation, between 2 and $10*10^{21}$ implanted atoms/cm³ can be typically obtained as an average concentration over the thickness implanted.

A particular calibration of the implantation equipment is performed depending on the type of beam, current density and temperature control of the substrate.

In order to keep the non-implanted region 24 on the surface of the pedestal substrate 20 and to avoid an untimely exfoliation or detachment phenomenon of this region 24, adequate dose and implantation temperature conditions below thresholds determined by the skilled person are provided.

Figure 3C:
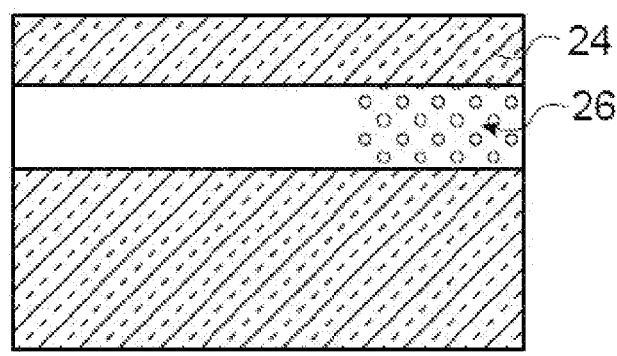

To allow formation of cavities also referred to as pores 26 to be completed in the implanted zone 22, implantation is typically followed by at least one first thermal annealing (FIG. 3C).

The temperature and duration of the first annealing are chosen especially as a function of the size or diameter desired to be imparted to the pores. Cavities or pores with a diameter between 2 nm and 250 nm, typically between 5 nm and 150 nm, preferably between 5 nm and 20 nm, can be formed. For example, annealing at a temperature of, for example, between 250° C. and 1000° C. and for a duration of between 5 min and 2 h can be implemented.

The pore formation method may also include a buried implantation of light ions followed by laser annealing. In particular, a pore formation method as described, for example, in the application filed by the applicant with the INPI and whose filing number is: FR1915019 can be used. This application FR1915019 is incorporated herein by reference.

The wavelength of the laser may be chosen so as not to be significantly absorbed by the layer 11 of silicon oxide. For example, a wavelength in the ultraviolet range, and more particularly a wavelength of 308 nm, may be chosen. The laser may be a pulsed laser, that is, for subjecting the structure to laser radiation intermittently by at least one laser pulse. The or each pulse may be of a duration ranging from one nanosecond to one microsecond.

A pore formation method as described for example in the PhD Thesis "caracterização da implantação de Ne em Si (100)", by Peripolli, 2007, and in particular chapters 3 to 6, can also be used.

In order to allow discharge or to complete discharge of gaseous species implanted in the layer having pores, the first implantation annealing can be followed by at least one second annealing.

In a case where the implanted species is Helium, a method as described, for example, in document "Helium implantation in silicon: the effects of implantation temperature", by Oliviero et al, Materials Science and Engineering B102 (2003) may be used to form the porous layer and then allow desorption of the Helium implanted.

Figure 3D:
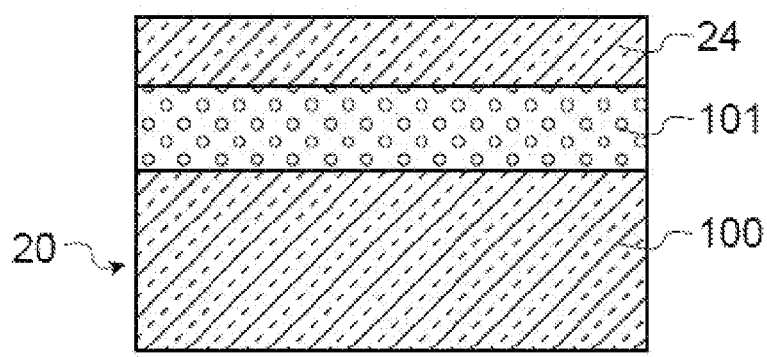

A porous layer 101 with a porosity that is at least partially empty and/or filled with gas, in particular rare gas can be obtained in this way (FIG. 3D).

This porous layer 101 is thus formed on and in contact with a support layer 100 as well as under and in contact with a non-porous surface region 24 of the pedestal substrate 20.

A layer of polycrystalline semiconductor material may then be formed in an upper region of the pedestal substrate 20.

For this, at least one upper thickness or portion 27 of the pedestal substrate 20 can be transformed into a semiconducting region rich in crystal defects and/or grain boundaries.

A method for producing such a region includes implementing an amorphisation implantation, to amorphise at least one thickness of the surface region 24 of the pedestal substrate that is non-implanted and kept non-porous.

The implantation dose and energy can be determined in advance using simulation tools as previously mentioned.

An amorphisation implantation can be performed, for example, using heavy ions, formed from Si or Ge, Ar, Xe, or F in a dose, for example, in the order of $10^{15}$ at/cm².

Figure 3E:
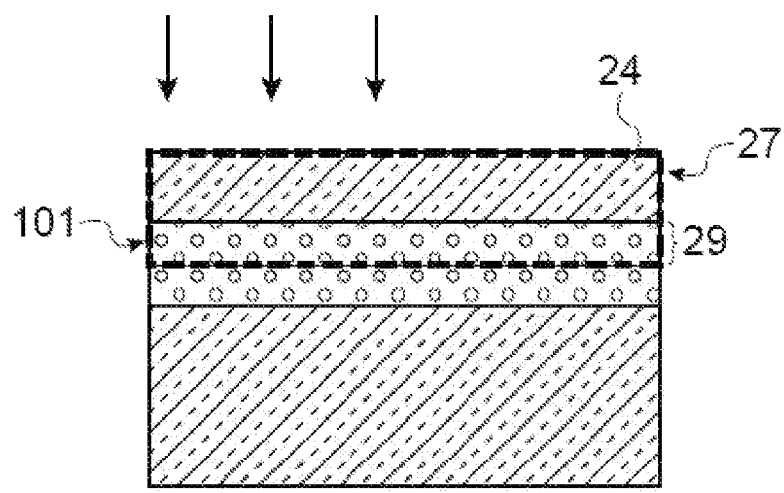

According to a possible implementation illustrated in FIG. 3E, the implantation energy can be provided so as to achieve amorphisation of the non-porous surface region 24 and at least one upper part 29 of the porous layer 101.

This amorphises at least one portion of the solid skeleton formed around the porosity. Thus, silicon amorphisation in the upper part 29 of the porous layer 101 can be performed, for example.

The thickness of amorphous material, in particular amorphised silicon can be between 5 nm and 500 nm, for example, preferably between 5 nm and 50 nm.

It is also possible to complete this amorphisation by a step of depositing amorphous semiconductor material, for example amorphous silicon onto the implanted upper portion 27. In this case, the deposition is preferably performed so as to form an amorphous layer with a roughness <6 Å rms (1×1 µm²).

At least one recrystallisation annealing is then carried out, with a duration and temperature provided so as to transform the amorphised semiconductor material into a material rich in crystal defects and/or grain boundaries. The annealing may advantageously be a rapid annealing provided in terms of duration and temperature for transforming the amorphised semiconductor material into a polycrystalline material.

For example, a rapid annealing, that is with a duration of less than 10 seconds and advantageously less than 2 seconds at a high temperature preferably above 800° C. but lower than 1400° C. can be carried out so as to transform amorphous Si into polycrystalline Si, the time/temperature combination being preferably chosen so as to obtain a rapid crystallisation around multiple seeds while avoiding uniformisation of the crystal orientation. For example for annealing at 1050° C. with a ramp up of 100° C./second and a duration at 1050° C. of less than 1 second.

According to an alternative embodiment, the formation of a polycrystalline semiconductor can also be implemented using a laser recrystallisation annealing. A laser of the so-called "nanosecond" type can advantageously be used as described, for example, in the application filed by the applicant with the INPI and whose filing number is FR1914563. This application FR1914563 is incorporated herein by reference. A laser can thus be used at a wavelength between 20 nm and 400 nm with a pulse duration typically less than one microsecond and for example in the order of one to several hundred nanoseconds.

In any case, a possible recrystallisation into single crystal silicon cannot be obtained due to the presence of the porous layer.

Figure 3F:
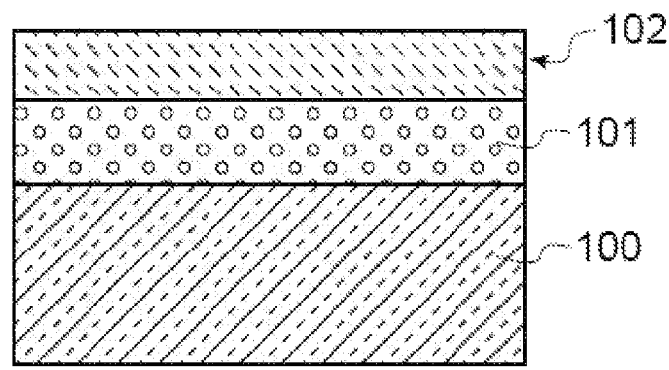

There is obtained (FIG. 3F) an upper layer 102 of a polycrystalline material, for example polysilicon, which can form a trap-rich layer, the trap-rich layer 102 being disposed on the porous layer 101, which can also form a trap-rich layer. This porous layer 101 is provided with a skeleton which, depending on the depth of amorphisation implantation, is preferably at least partially kept as a single crystal skeleton.

Onto this trap-rich layer 102, it is then typically provided to attach a stack comprising an insulating layer and a semiconducting layer, in order to form a semiconductor-on-insulator type substrate.

Optionally, thermal oxidation of part of the upper layer can be performed prior to amorphisation implantation, or even prior to implantation to lead to the porous layer.

In the exemplary embodiment just described, after implantation to form a porous layer, an optional thermal annealing is performed to promote degassing of the pores. Alternatively or in combination, such degassing may also be implemented during the recrystallisation annealing of the amorphous material. At least partial degassing can also be performed when porosification implantation is performed, in particular when such implantation is performed at high temperature.

According to another possible implementation, and in particular as an alternative to a method as previously described, annealing for promoting degassing of the pores can be performed after the amorphisation step, the annealing temperature thereby being below a solid phase recrystallisation temperature of the amorphous layer. Thus, when, for example, the method described previously in connection with FIGS. 3A-3F is referred to, the thermal annealing described previously in connection with FIG. 3C can alternatively be performed after the amorphisation described previously in connection with FIG. 3E. In this case, this thermal annealing is performed at a temperature below the recrystallisation annealing temperature, preferably at a temperature below 500° C. and which is for example between 200° C. and 450° C.

Annealing as previously discussed and for promoting degassing of the pores is optional. Thus, according to another alternative method, the porous layer is first formed using at least one implantation, for example helium implantation, in a buried region. The amorphous zone is then created at least partly above the cavities or the porous layer. Then, a recrystallisation annealing of the amorphous zone, typically using a laser is implemented. Degassing of the pores can then be performed during this annealing.

After either of the alternative methods as previously described, a method for transferring layers onto the pedestal formed by the stack of support layers 100, the porous layer 101, and the trap-rich layer 102 can then be performed.

Figure 4A:
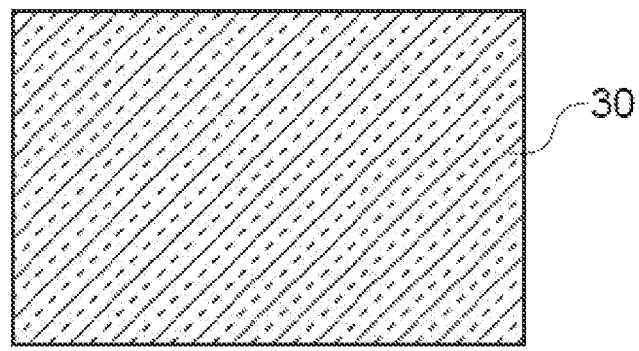
FIGS. 4A, 4B, 4C serve to illustrate an exemplary method for manufacturing a donor substrate to be assembled to a pedestal to form a semiconductor-on-insulator type substrate.
Figure 4B:
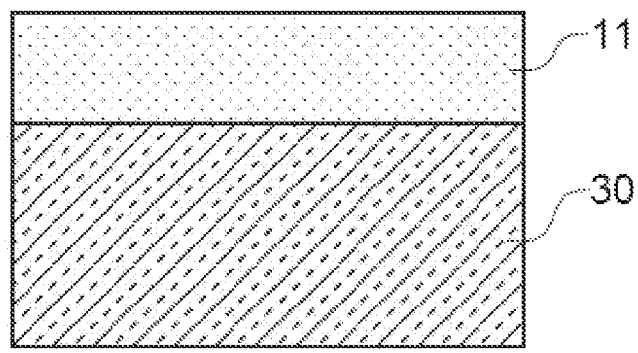
Figure 4C:
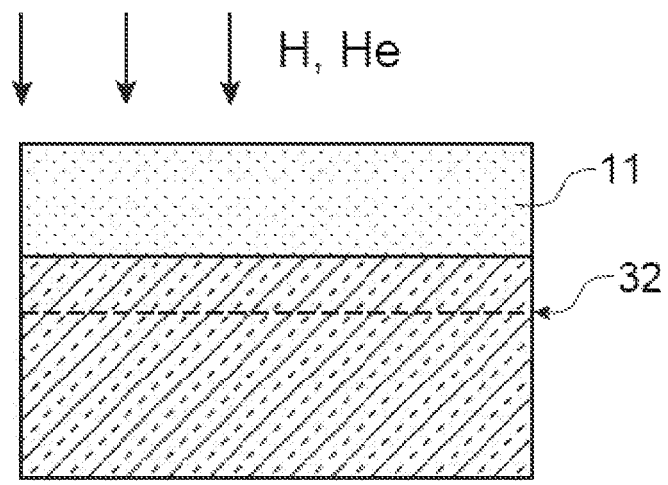

Such a transfer is typically performed using another support called a "donor substrate", an example manufacturing method of which is given in FIGS. 4A-4C.

The donor substrate 30 is initially typically a bulk substrate (FIG. 4A) of silicon with a resistivity, for example, in the order of 10 Ω·cm, on which the insulating layer 11 of silicon oxide is formed (FIG. 4B). Such a layer 11 is typically obtained by thermal oxidation. The insulating layer 11 formed has a thickness that can be between 10 nm and 1000 nm, for example.

An embrittlement zone 32 is then formed in the thickness of the donor substrate 30 (FIG. 4C), for example by implanting light ions H+ and/or He+ at a dose preferably greater than $10^{16}$ at/cm² and, at an energy preferably greater than 10 keV. For example, an implantation of H+ at a dose between $5*10^{16}$ at/cm² and $7*10^{16}$ at/cm² and an energy for example between 20 keV and 30 keV can be implemented.

A Smarcut™ type method can in particular be utilized.

The transfer onto the pedestal can then be achieved by means of molecular adhesion bonding.

Figure 5A:
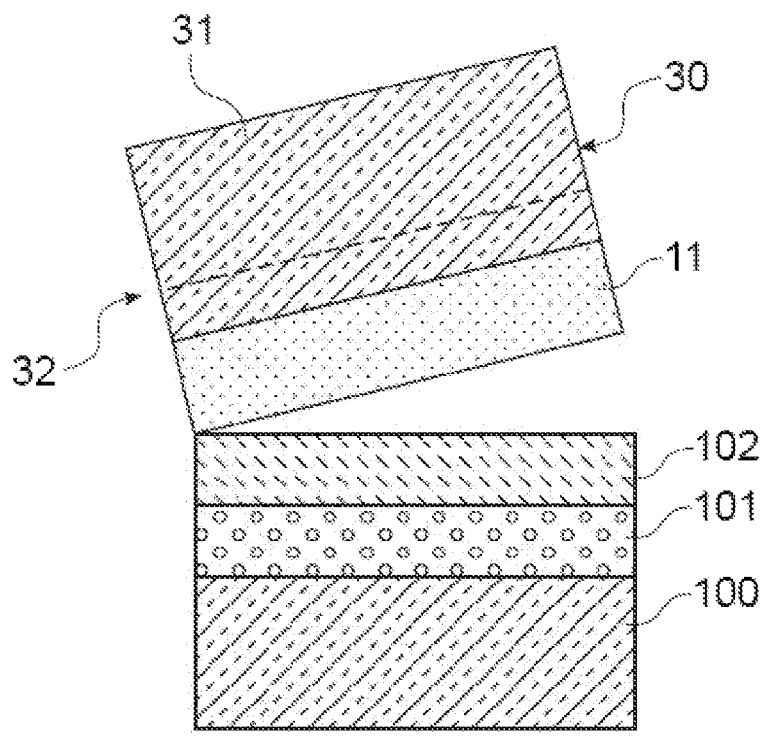
FIGS. 5A, 5B serve to illustrate an exemplary assembly method in which an insulating layer and a semiconducting surface layer are assembled to a pedestal in order to form a semiconductor-on-insulator type substrate.

A step of attaching the donor substrate 30 is illustrated in FIG. 5A. In this way, the insulating layer 11 is bonded to the layer 102 of polycrystalline semiconductor material.

Optionally, the pedestal can be coated with a typical insulating layer of silicon oxide.

The donor substrate 30 is then fractured at its embrittlement zone 32, so as to keep only a thin semiconducting layer of the donor substrate 30.

After separation of part of the donor substrate 30, thinning the thin semiconducting layer of this substrate 30 is performed by oxidising a zone of semiconductor material and etching the oxidised zone followed by annealing to smooth the surface.

Figure 5B:
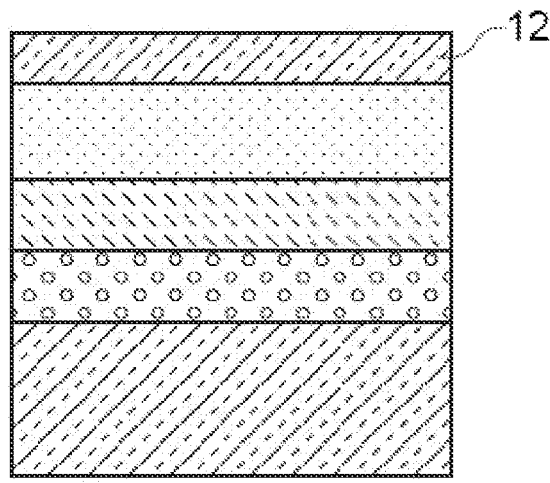

This thin semiconducting layer then forms the surface semiconducting layer 12 of the semiconductor-on-insulator substrate (FIG. 5B).

Other attachment or transfer techniques using direct bonding and mechanical, chemical, and/or chemical-mechanical thinning can also be used. These methods consist in assembling the donor substrate to the support substrate by molecular adhesion, and then thinning the donor substrate to the desired thickness of the thin semiconducting layer for forming an active layer, for example by grinding and chemical mechanical polishing (CMP).

Figure 6A:
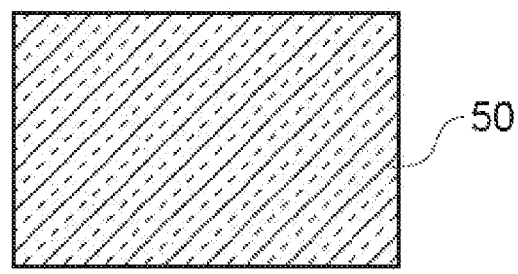
FIGS. 6A, 6B, 6C, 6D, 6E serve to illustrate another exemplary method for manufacturing a pedestal provided with a trap-rich layer to form an improved semiconductor-on-insulator type RF substrate.
Figure 6B:
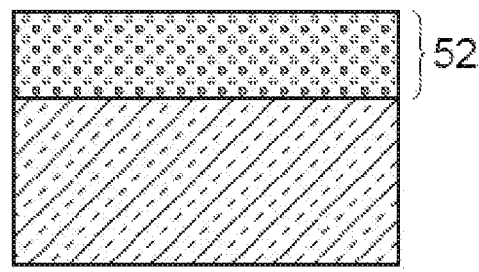

Another way of making superimposition of layers forming the substrate pedestal is to make a porous layer on the surface of a semiconducting substrate 50 (FIG. 6A) of semiconductor material, in particular a bulk substrate, for example of silicon.

The method for forming the porous layer on the surface of a substrate 50 may include implanting light ions followed by laser annealing leading to the formation of pores on the surface. Such a surface porosification and by implantation is described, for example, in the application filed by the applicant with the INPI and which filing number is FR1915021. This application FR1915021 is incorporated herein by reference.

One or more annealing steps can then be performed, especially in order to stabilize the material made porous and to discharge, in particular hydrogen, from the pores or cavities. For this, an annealing under oxidising atmosphere can be carried out at a temperature, for example, in the order of 300° C. and then a second annealing under neutral atmosphere at a temperature in the order of 420° C. The skeleton of the porous structure is then reinforced with oxide and any hydrogen that may be present on the pore walls is discharged.

Figure 6C:
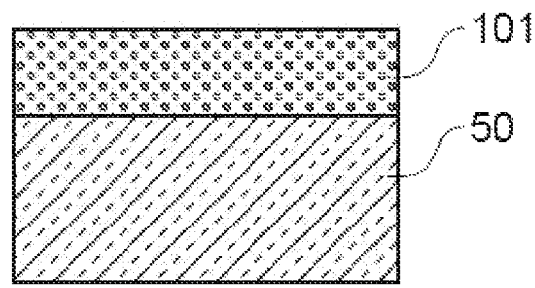

A porous layer 101 formed by a distribution of typically empty pores (FIG. 6C) is thus obtained. Insofar as porosification is carried out by implantation, the porosity obtained is a closed porosity.

The porous layer 101 obtained here is provided with a skeleton that can be advantageously preserved in its entirety as a single crystal skeleton, that is, over the entire thickness of the layer 101.

Figure 6D:
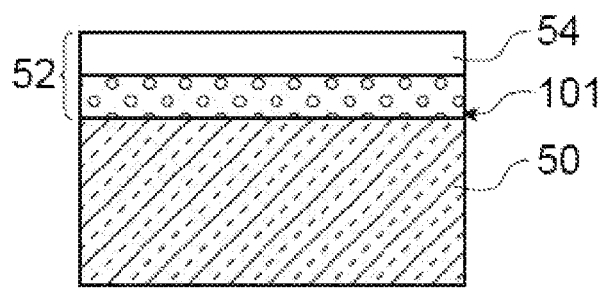

Next, an amorphous region 54 can be formed on the surface of the pedestal substrate 50, in other words at its upper face made porous (FIG. 6D).

One method for producing this region 54 includes depositing a layer of amorphous semiconductor material, in particular amorphous Si, directly onto the porous layer 101.

Preferably, an amorphous layer with a low roughness and in particular less than 6 Angstroms rms in a surface area of $1*1$ $\mu m^2$ is aimed at.

Figure 6E:
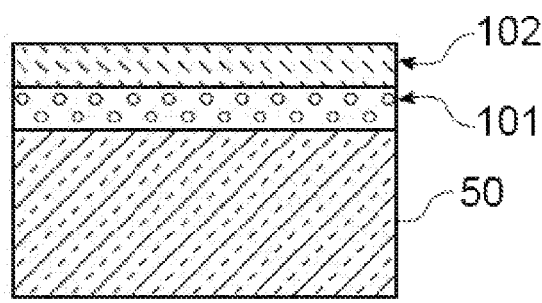

At least one recrystallisation annealing is then performed so as to transform at least one thickness of the layer of amorphous semiconductor material into a trap-rich layer 102, typically of polysilicon (FIG. 6E).

The annealing is preferably a rapid annealing performed at a temperature below 1100° C., for example at 1050° C. with a ramp up of 100° C./s and whose duration at the maximum temperature of 1050° C. is expected to be less than 1 second. The annealing can also be a nanosecond type laser recrystallisation annealing, as is described in the foregoing.

From the pedestal thus made, formation of a semiconductor-on-insulator type substrate can then be completed, for example by performing a method as previously described in connection with FIGS. 4A-4C and 5A-5B, during which attaching an insulating layer and a surface semiconducting layer onto the pedestal is performed.

Figure 7:
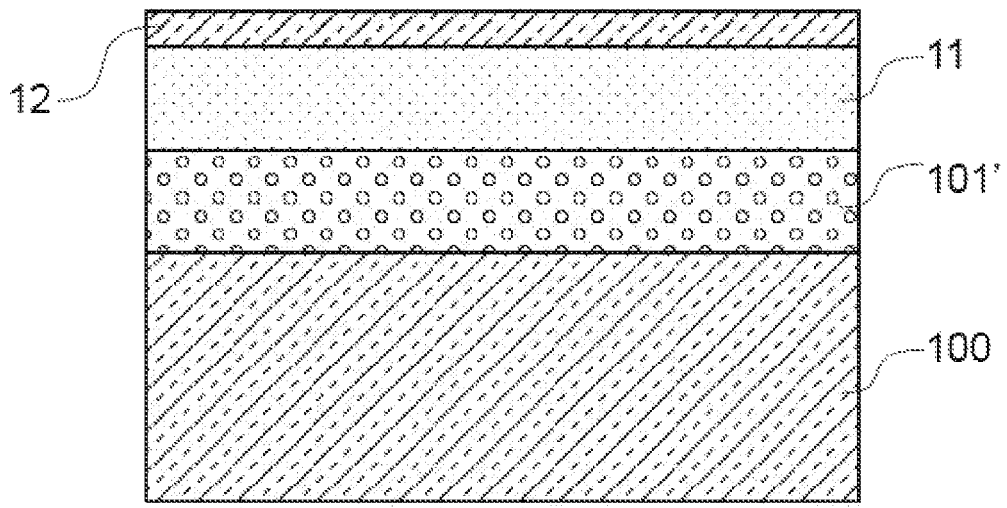
FIG. 7 serves to illustrate another exemplary semiconductor-on-insulator type substrate for RF applications provided with a layer of porous semiconductor material serving as a trap-rich layer.

An alternative embodiment of a semiconductor-on-insulator type substrate is given in FIG. 7.

For this alternative, a porous trap-rich layer 101', the skeleton of which is partly of porous polysilicon and partly of porous single crystal silicon having a porosity with empty or gas-filled pores is provided. The porous layer 101' has an upper face in contact with the insulating layer 11 of the substrate, and a lower face in contact with a semiconducting support layer 100 with high resistivity.

A method as previously described can also be applied to the implementation of an improved POI ("Piezoelectric On Insulator") type substrate.

Figure 8:
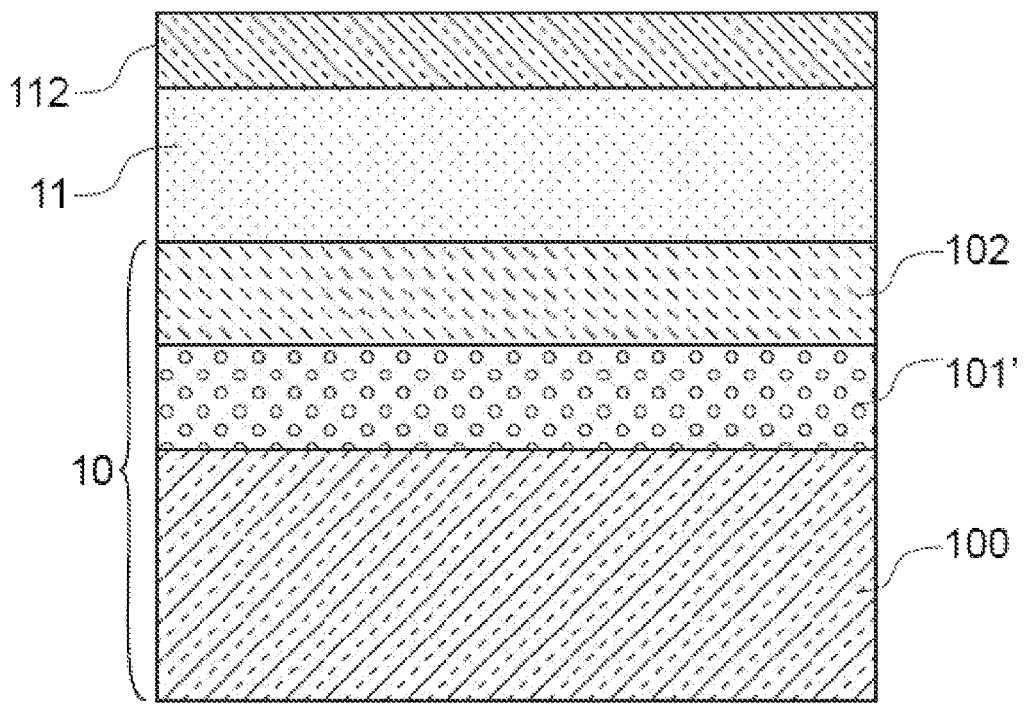
FIG. 8 serves to illustrate a POI type substrate implemented according to an embodiment of the present invention.

Such a substrate, represented in FIG. 8, is provided with a surface layer 112 of a single crystal piezoelectric material such as lithium tantalate or lithium niobate and can be used, for example, for manufacturing RF components such as acoustic wave, in particular surface acoustic waves (SAW) filters. In addition to the above-mentioned advantages about ohmic losses, the stack formed by the trap-rich layer 102 and the porous layer 101 reduces noise related to the propagation of parasitic waves.

Figure 9A:
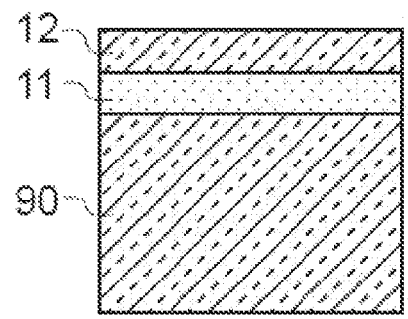
FIGS. 9A, 9B, 9C, 9D, 9E, 9F serve to illustrate another exemplary method for manufacturing a semiconductor-on-insulator type substrate provided with a trap-rich layer directly in this substrate.

According to an alternative embodiment, a semiconductor-on-insulator type substrate as illustrated in FIG. 9A is this time used as the starting material.

The substrate is provided with a surface semiconducting layer 12, for example of silicon, and rests on an insulating layer 11, typically of silicon oxide 11. The insulating layer 11 is in contact with the surface layer 12 and insulates the latter from a support layer 90, which is semiconducting and typically of silicon.

According to an alternative embodiment, a substrate with a support layer 90, which may be semiconducting and for example of silicon, is used as the starting material, the support layer being coated with an insulating layer 11 of silicon oxide 11.

A porous layer is then formed in the support layer 90. A method for producing this porous layer comprises implanting light ions (FIG. 9B), in particular ions of hydrogen or a rare gas such as, for example, Helium, or Neon, or Argon. The implantation dose and energy are chosen according to the thickness desired to be imparted to the implanted zone 92 and so as to keep a non-implanted region 94 in the support layer 90 between this zone 92 and the insulating layer 11. The implantation is thus carried out in a so-called "buried" zone 92. The implantation dose and energy can be determined using tools such as those previously given. Preferably the implantation is performed at a tilt angle in the order of zero degree with respect to a normal to a principal plane of the substrate. This promotes non-damage to the surface region. Such an implantation leads to the formation of a layer enriched in implanted elements 96.

In a case where the implanted species is Helium, a method as described, for example, in "Helium implantation in silicon: the effects of implantation temperature", by Oliviero et al, Materials Science and Engineering B102 (2003) can be used to form the porous layer and then allow desorption of the implanted Helium. Higher doses than the one described in this document and for example of between $0.5^e16$ and $7^e16$ He/cm² can be provided.

At least one thermal annealing (FIG. 9C) is then performed at a temperature and duration chosen according to the size or diameter desired to be imparted to the pores or a laser annealing. For example, an annealing at a temperature of between 250° C. and 1000° C. and for a duration of between 5 minutes and 2 hours can be used. In this way, a porous layer 101 with a porosity that is at least partially empty and/or filled with gas, in particular rare gas, is formed (FIG. 9D).

Then, a trap-rich layer is formed in an upper region of the support layer 90.

A method includes performing an amorphisation implantation, in order to amorphise the non-implanted region 94 that is between the insulating layer 11 and the porous layer 101. This implantation is, again, an implantation of a buried region that is not on the surface of the support implanted.

The amorphisation implantation can be achieved using, for example, Si or Ge or F. An exemplary method for obtaining a buried amorphous region by ion implantation is given in "Dopant-enhanced solid phase epitaxy in buried amorphous silicon layers" by Johnson et al. 2010, Physical review. B, Condensed matter 76(4) or in document "Formation of amorphous layers by ion implantation" by S. Prussin et al, Journal of Applied Physics 57, 180 (1985) or in document "Amorphization/recrystallization of buried amorphous silicon layer induced by oxygen ion implantation" by J. P. de Souza, Journal of Applied Physics 95, 877 (2004). Implantation is typically performed at a substrate temperature below a temperature allowing dynamic annealing of defects created during implantation. For example, to amorphise silicon, implantation is performed at a temperature below 250° C. and preferably at a temperature T below 100° C. Implantation at very low substrate temperature can be implemented.

For example, implantation of the buried zone 22 can be performed using Lithium by bringing the substrate to a temperature that can correspond to that of liquid nitrogen, implementing a method of the type described, for example, in document "Lithium implantation at low temperature in silicon for sharp buried amorphous layer formation and defect engineering", Journal of Applied Physics 113, 083515 (2013), E. Oliviero et al.

To amorphise silicon, a species selected from at least one of the following: Si, C, O, Ne can for example be used. Preferably the implantation is done with a tilt angle in the order of zero degree with respect to a normal to a principal plane of the substrate, which promotes preservation of the surface semiconducting layer of the substrate.

Figure 9B:
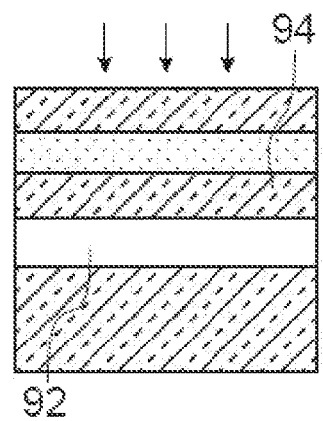
Figure 9C:
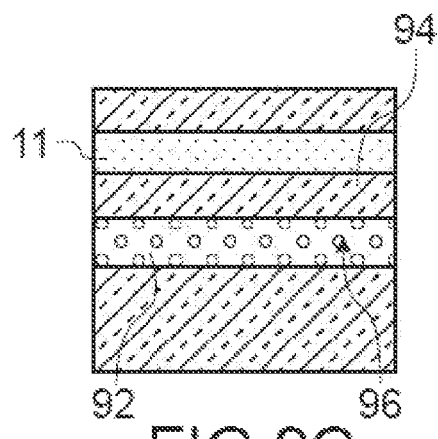
Figure 9D:
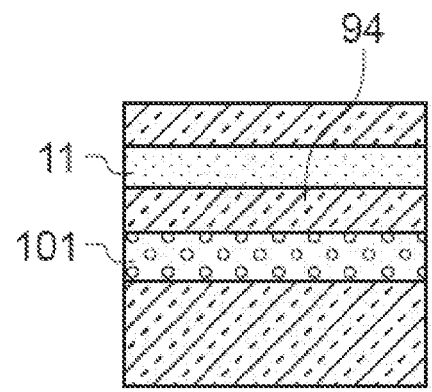
Figure 9E:
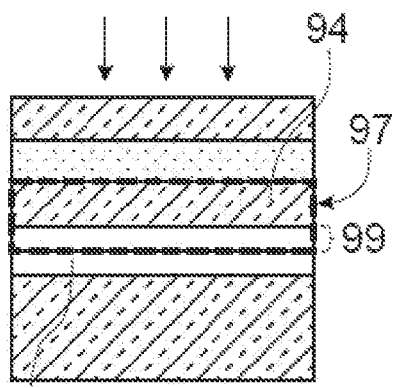

According to a possible implementation illustrated in FIG. 9E, the implantation energy may be provided so as to perform amorphisation of a zone 97 comprising the non-porous region 94 of the support layer located under the insulating layer 11 and at least one upper part 99 of the porous layer 101 located under that region 94. This amorphises at least one portion of the solid skeleton formed around the pores and in particular the upper part thereof.

At least one recrystallisation annealing is then carried out, of a duration and temperature provided so as to transform the amorphised semiconductor material into a material rich in crystal defects and/or grain boundaries. Advantageously, the annealing may be a rapid annealing provided in terms of duration and temperature to allow the amorphised semiconductor material to be transformed into a polycrystalline material. For example, a rapid annealing, i.e. with a duration of less than 10 seconds and advantageously less than 2 seconds at a high temperature preferably above 800° C. but below 1400° C. can be performed in order to transform amorphous Si into polycrystalline Si.

A nanosecond type laser annealing can be performed. The laser source can advantageously emit in the UV range, the laser having for example a wavelength in the order of 308 nm and emitting one or more pulses each of duration between 1 ns and 1 µs, for example in the order of 200 ns.

This annealing can also be adapted to form crystal nuclei in the amorphous range, followed by an annealing, for example of the RTA (for "Rapid Thermal Anneal") or conventional type, to develop a poly-Si structure.

Figure 9F:
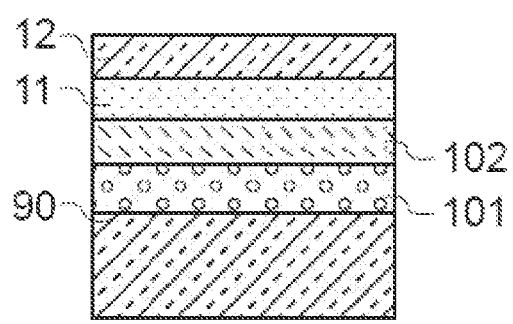

A layer 102 of polycrystalline material, for example polysilicon, which could form a trap-rich layer is thus obtained (FIG. 9F).

Repair of the crystal structure of the surface layer 12 can then be implemented. For this, thermal annealing is carried out at high temperature, typically above 900° C. and preferably below 1150° C., for a duration of between 5 minutes and 4 hours.

Figure 10A:
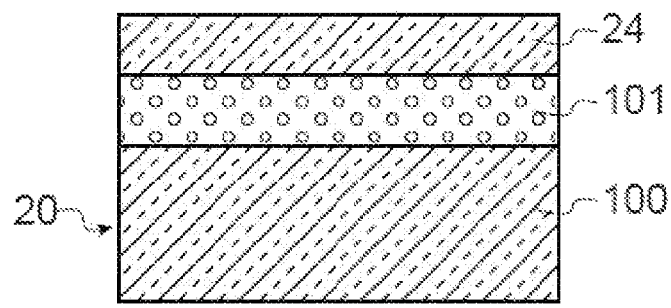
FIGS. 10A, 10B serve to illustrate an alternative method for manufacturing a semiconductor-on-insulator type substrate.
Figure 10B:
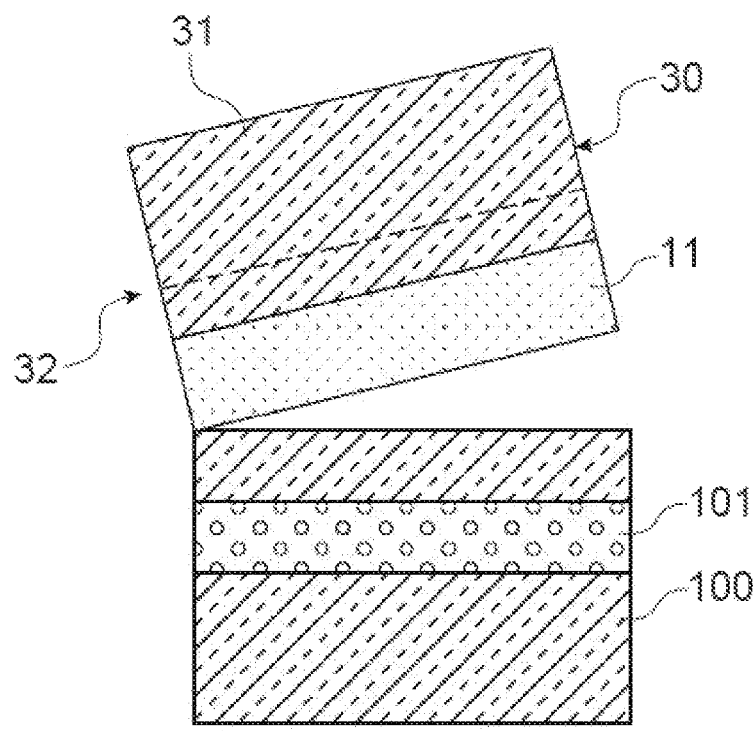

According to another possible implementation illustrated in FIGS. 10A-10B, the porous layer 101 can first be produced (FIG. 10A) in a bulk pedestal substrate 20. Then, a transfer of the type previously described in connection with FIGS. 5A-5B is performed (FIG. 10B) from a donor substrate 30 coated with the insulating layer 11 onto the pedestal. Then, the layer 102 of polycrystalline semiconductor is formed.

Figure 11:
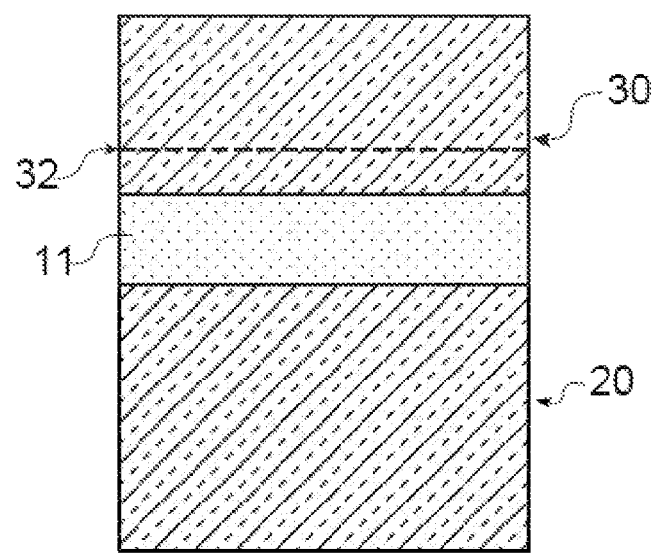
FIG. 11 serves to illustrate a particular structure from which a porous layer and a layer of polycrystalline semiconductor material can be formed to produce the trap-rich layer.

According to another possible implementation, the porous layer 101 and the layer of polycrystalline material 102 can be produced after obtaining a structure as illustrated in FIG. 11 obtained by means of a transfer of the type described in connection with FIG. 5A, of a donor substrate 30 coated with an insulating layer 11 onto a pedestal as a bulk substrate 20.

In this case, the implantations and annealing are carried out to form the porous layer 101, the layer 102 of polycrystalline semiconductor, before the finishing step(s) resulting in obtaining the surface semiconducting layer 12. Thus, these steps can be carried out before a final thinning oxidation or before a smoothing annealing with high thermal budget.

It may also be provided, to produce the porous layer 101 and layer 102 of polycrystalline semiconductor after the transfer previously described and in particular after fracturing the donor substrate 30, but before a thinning step for example by oxidation resulting in obtaining the surface semiconducting layer 12.

According to one alternative embodiment of either of the methods previously described, a localised trap-rich layer or region may be formed, that is, that extends facing only a given region of the surface semiconducting layer 12 of the semiconductor substrate, this given region of the surface layer 12 being typically the one on which one or more RF components are made.

Figure 12:
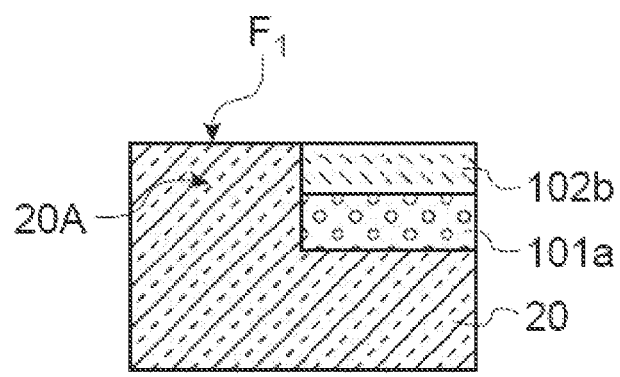
FIG. 12 serves to illustrate another exemplary method for manufacturing a pedestal provided with a localised trap-rich region that does not extend over the full width of the substrate.

Thus, in the exemplary embodiment illustrated in FIG. 12, where a bulk substrate pedestal 20 is used as a starting point, a porous layer 101a and a layer 102a of polysilicon are formed on the latter to form a localised trap-rich layer that does not extend over the entire width of the support 20.

The stack of porous 101a and trap-rich 102a layers is here juxtaposed to a zone 20A of the pedestal substrate 20 kept intact, in other words neither porosified nor polycrystallised. To obtain such an arrangement, a region of the pedestal substrate 20 facing the zone 20A is typically masked during implantation steps as previously described, and in particular during the implantation step(s) by means of light ions to produce the porous layer 101a and then during the amorphisation step(s) to produce an amorphous zone on this porous layer, which is then subjected to a heat treatment in order to produce the layer 102a of polycrystalline material.

The structure thus obtained and illustrated in FIG. 12 can then be attached as in the exemplary embodiment previously described in connection with FIGS. 5A-5B in order to produce a semiconductor-on-insulator type substrate.

Thus, a face F1 of the pedestal substrate 20 is attached onto the insulating layer 11 of a donor substrate 30, on the side of which the layer of polycrystalline semiconductor material 102a is located and which can be revealed at this face F1. The donor substrate 30 is then fractured, so that only a thin semiconducting layer 12 thereof is kept. This semiconducting layer 12 then forms the surface layer of a semiconductor-on-insulator substrate provided with a trap-rich layer.

Figure 13A:
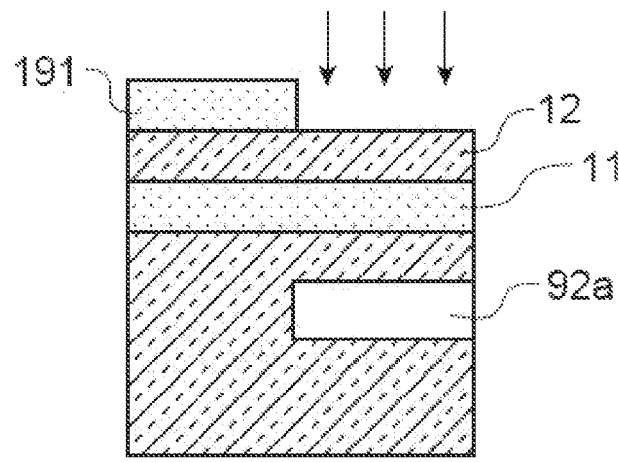
FIGS. 13A, 13B, 13C serve to illustrate another exemplary method for manufacturing a localised trap-rich region from a semiconductor-on-insulator type substrate.
Figure 13B:
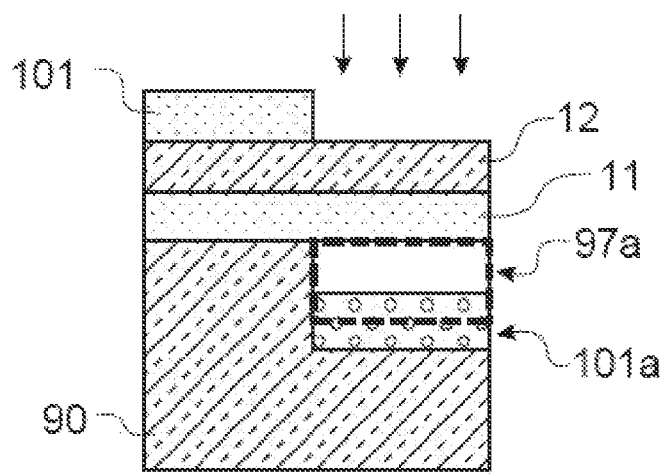
Figure 13C:
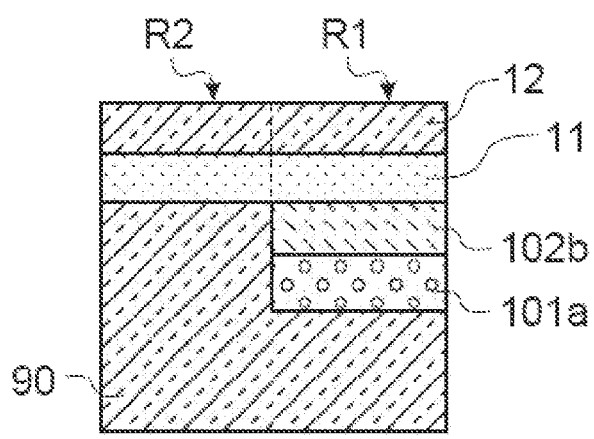

In another exemplary embodiment illustrated in FIGS. 13A-13C, the localised porous layer and the localised layer of polycrystalline semiconductor material are this time made in a semiconductor-on-insulator type substrate and for example such as the substrate 90 previously described in connection with FIG. 9A.

In order to obtain a localised trap-rich layer that extends facing only a part of the layer, a mask 191 is typically formed on a region of the substrate in order to protect this given region during the implantation of a zone 92a located under the insulating layer 11 and at a distance from the latter (FIG. 13A) in order to produce the porous layer. The mask 191 is chosen according to the technology used and can be made according to the integration step to also protect other zones of the substrate, devices or stacks already present. This mask 191 may be a lithography resin, or a hard mask for example. The hard mask may be formed of SiN, or $SiO_2$, or amorphous carbon, or a stack of one or more of these materials.

Then, in the amorphisation implantation step, a mask, preferably the same mask 191 (FIG. 13B) is kept on the same given region of the substrate in order to implant a zone 97a located under the insulating layer 11 of the substrate and extending into the upper part of the porous layer 101a.

After an optional step of removing the mask 191 and an annealing step to transform at least one part of the implanted zone 97a into polycrystalline material, a localised layer 102a of polycrystalline material arranged on a localised porous layer 101a is obtained (FIG. 13C) under the insulating layer 11 of a semiconductor-on-insulator type substrate. The layer of polycrystalline semiconductor material 102a and the porous layer 101a are thus arranged facing a given region R1 of said surface layer 12, for example dedicated to an RF component or circuit. Another region R2 of this surface layer 12 juxtaposed to the given region R1 and which may be dedicated to other types of components, for example, is not located facing said layer 102a of polycrystalline semiconductor material or said porous layer 101a.

According to another alternative embodiment, the amorphisation by implantation and the recrystallisation of the amorphised zone into polycrystalline material can also be performed even before performing porosification and in particular before performing implantation(s) for forming the porosity, for example by Helium implantation. Optionally, this porosification implantation can be performed at high temperature.

Thus, if the exemplary embodiment of the method previously described in connection with FIGS. 9A-9F is referred to, the buried amorphous zone and a recrystallisation of this zone can be carried out even before the buried porous layer whose production has been described in connection with FIGS. 9B-9C.

Porosification is advantageously carried out immediately after the recrystallisation while keeping a limited thermal budget between these two steps.

According to another alternative embodiment, amorphisation can also be performed by implantation even before performing the implantation(s) for forming the porosity, for example by Helium implantation. Optionally, this implantation can be carried out at high temperature. Then, after porosification, a recrystallisation annealing is performed, for example using a laser in order to recrystallise the amorphised zone. Such annealing can be provided at a temperature that allows the pores to be degassed.

The invention claimed is:

1. A structure provided with a substrate comprising a surface layer on or above which at least one RF circuit component, is formed or is to be formed, said surface layer being disposed on, and in contact with, an insulating layer, said insulating layer being disposed on, and in contact with, a pedestal, said pedestal comprising:
    a support layer of a given semiconductor material,
    a trap-rich layer comprising a layer of polycrystalline semiconductor material located between said insulating layer and said support layer, said pedestal further comprising, between said support layer and said insulating layer:
    a porous layer provided with a lower face in contact with said support layer, said porous layer being formed of a porous material with closed pores, the closed-pore porous material being composed of a solid skeleton and a distribution of closed pores, the closed pores being empty or filled with gas.

2. The structure according to claim 1, said layer of polycrystalline semiconductor material comprising an upper face in contact with said insulating layer, and a lower face opposite to said upper face, said lower face being in contact with said porous layer.

3. The structure according to claim 2, an upper portion of said solid skeleton of the porous layer being in contact with said lower face of said layer of polycrystalline semiconductor material and also being of polycrystalline semiconductor material.

4. The structure according to claim 2, wherein the solid skeleton of the porous layer is of single crystal semiconductor material, in particular integrally of single crystal semiconductor material, the porous layer and the layer of polycrystalline semiconductor material being superimposed.

5. The structure according to claim 1, the trap-rich layer and the porous layer being distinct layers, said solid skeleton being at least partially a single crystal skeleton.

6. The structure according to claim 1, a layer of amorphous semiconductor material being arranged between the trap-rich layer and the porous layer.

7. The structure according to claim 1, wherein said layer of polycrystalline semiconductor material and said porous layer are located facing a given region of said surface layer, another region of said surface layer juxtaposed to said given region being not located facing said layer of polycrystalline semiconductor material or said porous layer.

8. A microelectronic device comprising a structure according to claim 1, wherein said surface layer is a semiconducting layer, the device comprising:
    at least one transistor, said transistor having a channel region arranged in said surface semiconducting layer, and/or,
    an RF component, in particular of the inductor or antenna type.

9. A method for manufacturing a structure according to claim 1, wherein the porous layer is made by porosifying a layer of given semiconductor material of said pedestal by implanting, in particular hydrogen or rare gas, implanting being followed by thermal annealing and/or laser treatment.

10. The method according to claim 9, wherein said implanting is performed so as to form a porous surface region on the surface of said pedestal.

11. The method according to claim 9, wherein producing the layer of polycrystalline semiconductor material comprises depositing a layer of amorphous semiconductor material onto the porous layer.

12. The method of claim 9, wherein producing the layer of polycrystalline semiconductor material comprises amorphisation implanting a region of said pedestal so as to form an amorphous region.

13. The method according to claim 12 wherein said porous layer is formed by ion implantation so as to keep a non-porous surface region on the porous layer, said amorphisation implantation being performed so as to form the amorphous region in at least said surface region or at least said surface region and an upper part of said porous layer.

14. The method according to claim 11, wherein the method further comprises a recrystallisation step, by laser annealing and/or by thermal annealing with temperature and duration provided so as to transform said amorphous semiconducting layer or said amorphous region into said layer of polycrystalline material.

15. The method according to claim 8, wherein said porous layer and said layer of polycrystalline material are formed in a bulk substrate or of a bulk substrate covered with an insulating layer forming said pedestal, the method comprising a step of attaching a donor substrate onto said bulk substrate, said donor substrate comprising an insulating layer and a layer of piezoelectric or semiconductor material in which said surface layer is able to be formed.

16. The structure according to claim 1, wherein said solid skeleton is made of a semi-conductor material.

17. The structure according to claim 1, wherein said solid skeleton is made of said given semiconductor material.

\* \* \* \* \*